(12) United States Patent
Repetto et al.

(10) Patent No.: US 7,712,930 B2
(45) Date of Patent: May 11, 2010

(54) MODULE FOR PROJECTING A LIGHT BEAM

(75) Inventors: Piermario Repetto, Orbassano (IT);
 Denis Bollea, Orbassano (IT); Stefano Bernard, Orbassano (IT); Davide Capello, Orbassano (IT)

(73) Assignee: C.R.F. Societa Consortile per Azioni, Turin (IT)

( * ) Notice: Subject to any disclaimer, the term of this patent is extended or adjusted under 35 U.S.C. 154(b) by 286 days.

(21) Appl. No.: 11/531,501

(22) Filed: Sep. 13, 2006

(65) Prior Publication Data
US 2007/0058138 A1 Mar. 15, 2007

(30) Foreign Application Priority Data
Sep. 14, 2005 (EP) ................... 05425640

(51) Int. Cl.
*F21V 7/00* (2006.01)
(52) U.S. Cl. .............. 362/309; 362/307; 362/308; 362/310; 362/326; 362/327; 362/328; 362/329; 362/332; 362/333; 362/334; 362/335; 362/336; 362/337; 362/338; 362/339; 362/340
(58) Field of Classification Search ......... 362/307–311, 362/326–329, 332–340
See application file for complete search history.

(56) References Cited
U.S. PATENT DOCUMENTS
5,841,596 A 11/1998 Perlo (Continued)

FOREIGN PATENT DOCUMENTS
JP 61-147585 7/1986

(Continued)

OTHER PUBLICATIONS
http://dictionary.reference.com/browse/cross-section.*

(Continued)

*Primary Examiner*—Sandra L O'Shea
*Assistant Examiner*—William J Carter
(74) *Attorney, Agent, or Firm*—Sughrue Mion, PLLC

(57) ABSTRACT

An optical module for projecting a light beam comprises a solid body of transparent material into which a light source is sunk and which is delimited by an annular surface and by a central surface, and a substantially annular reflecting surface arranged around the solid body. The central and annular surfaces are suitable for receiving respective distinct portions of the luminous flux produced by the source. The reflecting surface may have a reflecting coating or may form part of a transparent body, in which case it works by total internal reflection. The reflecting surface reflects a portion of luminous flux refracted by the annular surface and shapes the flux into a predetermined distribution of luminous intensity about the principal axis. The annular surface is designed in a manner such as to reduce the overall thickness of the module by moving the refracted ray away from the principal axis. The central surface shapes the other portion of the luminous flux emitted by the source into a predetermined distribution of luminous intensity about the principal axis. The surfaces cooperate so as to shape the luminous flux as a whole emerging from the source into a distribution of luminous intensity having divergences which may be different in two directions that are perpendicular to one another and to the principal axis.

39 Claims, 15 Drawing Sheets

U.S. PATENT DOCUMENTS

| | | | |
|---|---|---|---|
| 5,884,995 A | | 3/1999 | Perlo |
| 6,166,860 A * | 12/2000 | Medvedev et al. | 359/641 |
| 7,111,964 B2 * | 9/2006 | Suehiro et al. | 362/328 |
| 7,244,924 B2 * | 7/2007 | Kiyomoto et al. | 362/327 |
| 7,300,177 B2 * | 11/2007 | Conner | 362/244 |
| 2002/0080615 A1 * | 6/2002 | Marshall et al. | 362/333 |
| 2006/0028829 A1 * | 2/2006 | Amano et al. | 362/505 |

FOREIGN PATENT DOCUMENTS

| | | |
|---|---|---|
| JP | 2005-190859 | 7/2005 |
| WO | WO 00/24062 | 4/2000 |

OTHER PUBLICATIONS http://dictionary.reference.com/browse/coincide.*
http://wordnetweb.princeton.edu/perl/webwn?s=focus.*
http://wordnetweb.princeton.edu/perl/webwn?s=focus, May 1998.*
http://dictionary.reference.com/browse/cross-section, Nov. 2006.*
http//dictionary.reference.com/browse/coincide, Jul. 2006.*
NPL documents added to the record on Dec. 19, 2008.*

* cited by examiner

Horizontal angle

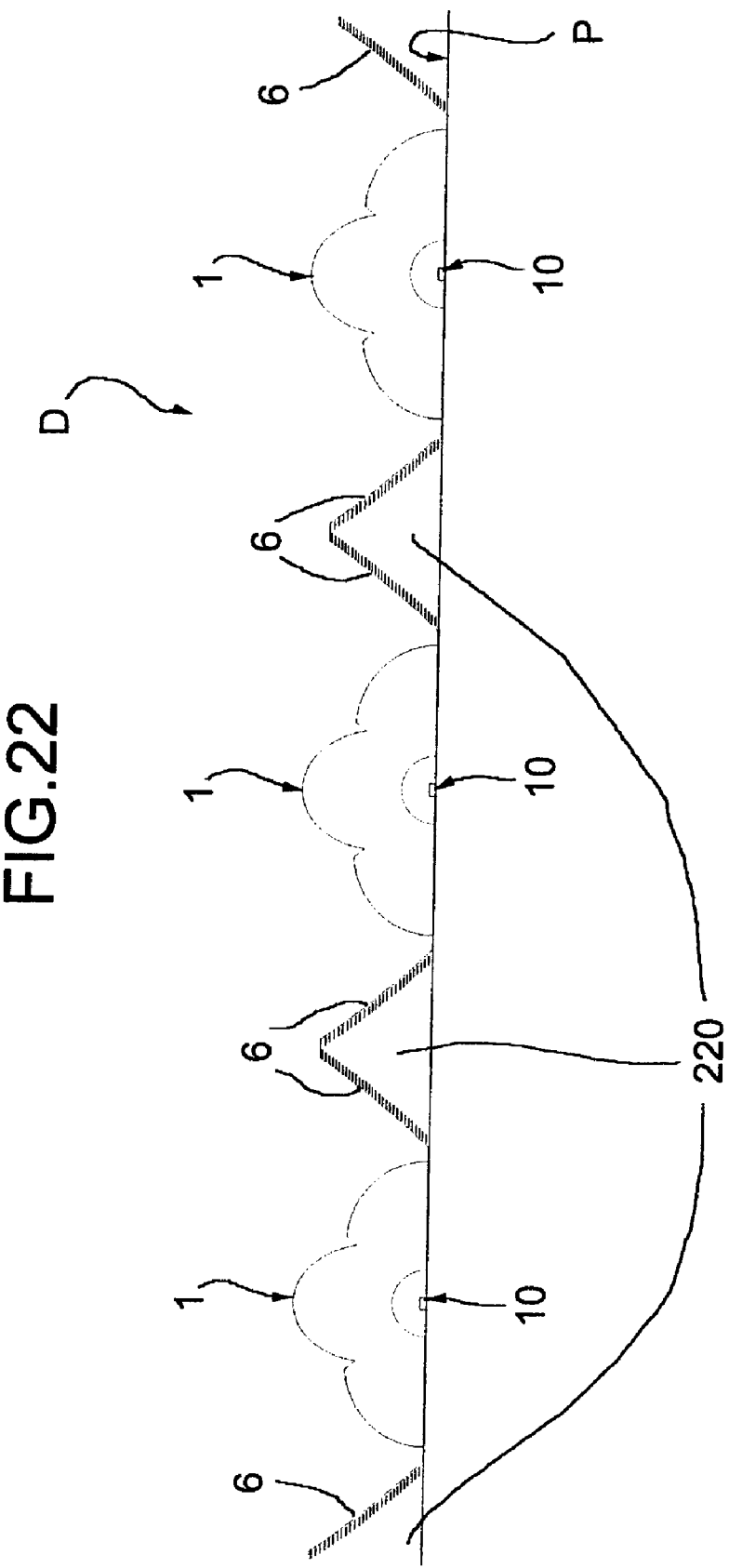

MODULE FOR PROJECTING A LIGHT BEAM

The present invention relates in general to modules for projecting light beams.

Modules of this type are already known, for example, from Japanese patent application JP 61-147585, which describes a module that collimates a light beam and comprises an LED mounted on a support and a total internal reflection lens having a recess in which the LED is housed. Both the lens and the LED are housed in a cylindrical housing.

The main advantage of the devices of the Japanese patent application lies in the fact that they have high luminous efficiency, that is, the ratio between the flux re-emitted by the device and that emitted by the source is generally greater than 85%, precisely because total internal reflection is used. Another important advantage lies in the fact that it is not necessary to coat the device with a metal coating to enable the rays incident on the lateral surfaces to be reflected.

In general, several modules of this type can be arranged on a shared support surface on which a plurality of sources are disposed to produce an illumination device. The direction of collimation is perpendicular to the support surface and the intensity distribution is radially symmetrical with respect to the direction of collimation.

Alternatively, a prismatic component may be introduced by a prismatic shaping performed on the output surface of the collimator (patent application WO 00/24062), in order to deflect the collimated light beam in a different direction from the original collimation direction.

In most practical cases, an optical device must be able not only to collimate the light beam emerging from the source but also to shape it in accordance with a desired distribution of luminous intensity. By way of example, for the various indicating functions of motor-car lights, the light beams output by the system must comply with certain divergence requirements that are set by the norms which are in force on the subject.

For example, for the stop function, the divergence of the beam in the horizontal plane (parallel to the road) is critical since half-angles of divergence greater than 20° are required, whereas the half-divergence in the vertical direction is markedly less (10°). With the use of radially symmetrical modules (as described in patent applications JP 61-147585 and WO 00/24062), a distribution with substantially equal divergences in the horizontal and vertical directions is generally obtained; compliance with the photometric norms in the horizontal direction therefore involves the provision of a greater vertical divergence than is required, with a consequent wastage of luminous flux and an increase in consumption and/or in the number of sources, and hence in costs.

International patent application WO 00/24062 proposes a possible solution to this problem by introducing a prismatic component which is different for the various collimators making up the system so that the combination of these collimators enables a predetermined light distribution to be produced. The limitation of this solution is mainly that, for a certain direction of observation, only the portion of the device comprising the collimators which collimate the light in that direction of observation will appear to be illuminated.

Generally, to produce a predetermined light distribution, the collimators can be combined with prismatic shaping or micro-lenses which can widen the beam emerging from the collimator and possibly modify its direction.

An advantageous solution for the production of a device having different divergences in the two principal directions has been proposed by the Applicant of the present application in U.S. Pat. No. 5,841,596 and U.S. Pat. No. 5,884,995. These patents relate to a micro-telescope device of the Cassegrain type. As is known, a Cassegrain telescope is formed by a primary reflector which directs the light coming from the exterior and collects it towards the secondary reflector; the secondary reflector further focuses the beam and the image is finally created in the desired plane. Owing to its particular geometry, a Cassegrain telescope has a dark area corresponding to the secondary reflector, where the light cannot be picked up. These two patents utilize the inverse principle, that is, the light beam is generated by an almost point-like source, for example, of the LED type which is disposed in the image plane of the telescope and the light is extracted from the primary reflector after it has been reflected by the secondary reflector. The device is generally made of plastics or transparent resin.

The main advantage of the telescopic system lies in the fact that it enables the thickness of the optical device to be greatly limited; another advantage is that the individual modules can have a high width-height ratio which means that an extensive area of the device can be covered with the use of a limited number of modules.

The main disadvantage is that it is necessary selectively to coat some portions of the headlight with reflecting metal layers which reduces efficiency and leads to a significant increase in production costs.

Another, purely aesthetic disadvantage is that the light is not extracted from the whole output surface of the device but only from the outer circular ring in the region of the primary reflector, with the result that a darker central region is evident.

A solution which can improve the problems of the above-mentioned devices was put forward by the Applicant in European patent application No. 04425775.6. This patent application relates to an optical element for the projection of a light beam which element is rotationally non-symmetrical with respect to the principal axis of the transparent body.

With this optical element, it is possible to produce a module which operates to control the light emitted by an almost point-like source (for example, an LED of the SMD type or in chip form). It is thus possible to construct an illumination device, in particular a motor-vehicle light, in which each individual indicating function is constituted by a plurality of the said modules, juxtaposed and/or interconnected. The surfaces of the modules work both by refraction and by total internal reflection in a similar manner to that provided for in patent applications JP 61-147585 and WO 00/24062.

The intensity distribution produced by the modules of European patent application No. 04425775.6 is rotationally non-symmetrical and enables the number of sources/modules required to achieve a specific indicating function to be minimized.

The main advantages of this device are an improvement in the uniformity of the luminance of the surface of the device, maximized overall efficiency permitting a reduction in devices and costs per light unit, a reduction in size, and a limited manufacturing cost since metal coatings are not required.

The object of the present invention is to provide an optical device which utilizes the advantages of the solutions described above, further improving some aspects of them, in particular:

further reducing the thickness of the optical system,
maximizing the efficiency of the individual device.

According to the invention, this object is achieved by means of an optical module for projecting a light beam having the characteristics defined in claim 1.

With this optical module, it is possible to control the light emitted by a semiconductor source in chip form. A main transparent body contains, sunk into its interior, a source, preferably a semiconductor source. The body has two different surfaces both working by refraction. In one embodiment of the invention, the first of these surfaces can produce a rotationally asymmetrical intensity distribution. The second surface faces a secondary optical unit comprising at least one reflecting surface and can form a beam with a desired divergence.

Preferred embodiments of the invention are defined in the dependent claims.

Some preferred but non-limiting embodiments of the invention will now be described with reference to the appended drawings, in which:

FIG. 1 is a schematic, three-dimensional view of an optical module for projecting a light beam according to the invention;

FIGS. 2a,b are schematic longitudinal sections through the optical module of FIG. 1, taken on the lines IIA-IIA and IIB-IIB of FIG. 2c, respectively;

FIG. 4 shows a variant of the module of FIG. 1 having a segmented central surface, in a view similar to that of FIG. 2a;

Figure 1:
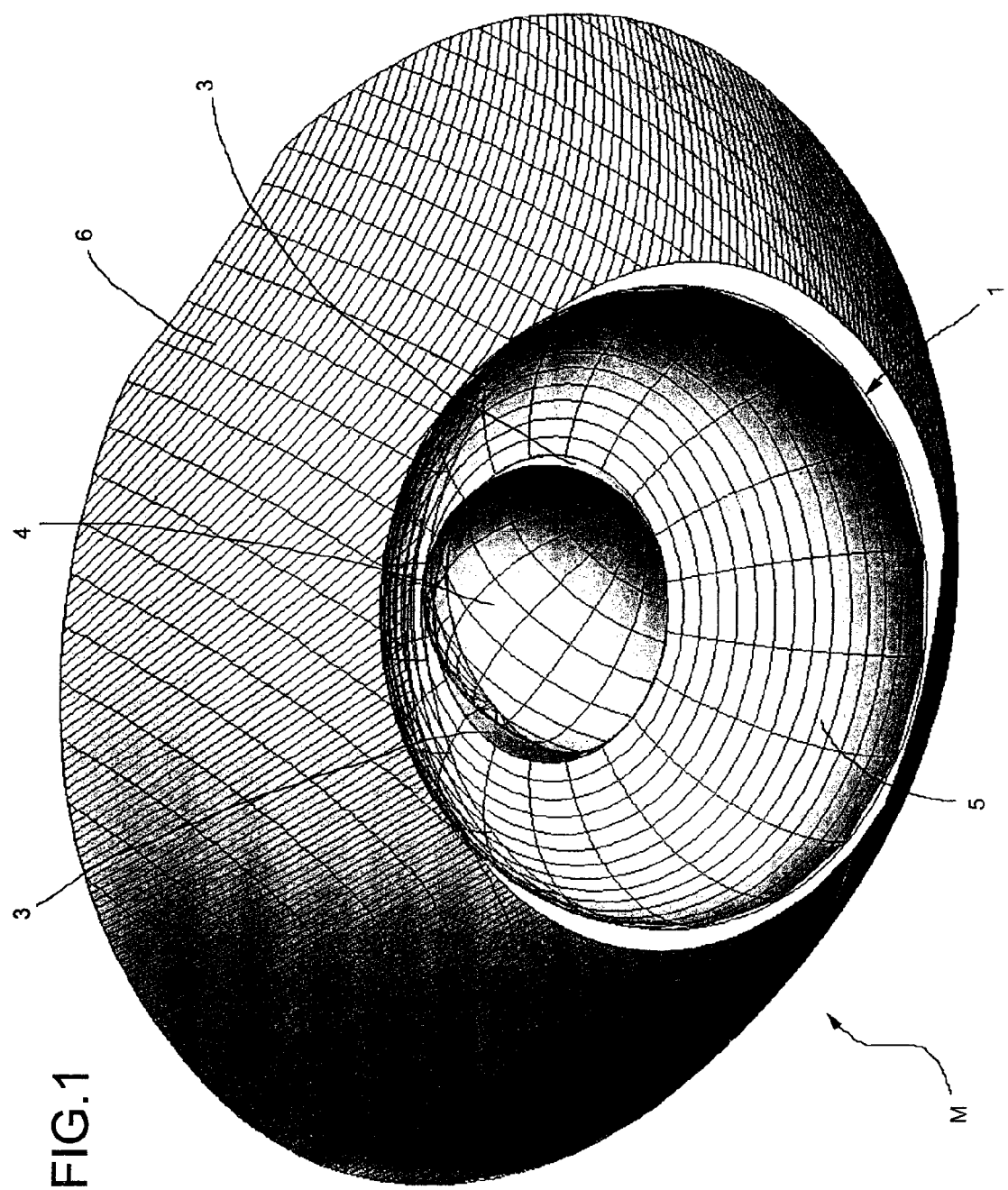
Figure 2A:
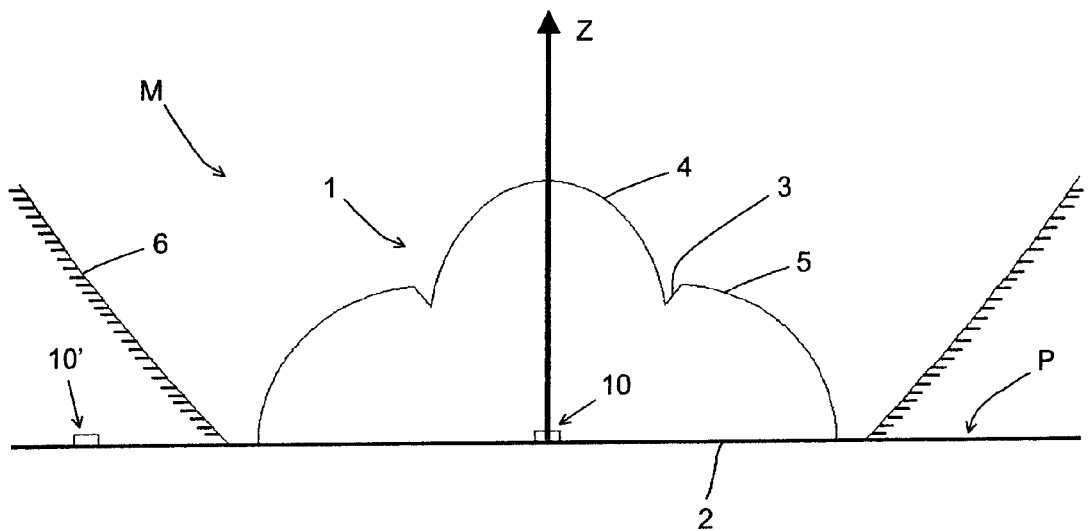
FIG. 2c is a plan view of the optical module of FIG. 1.
Figure 2B:
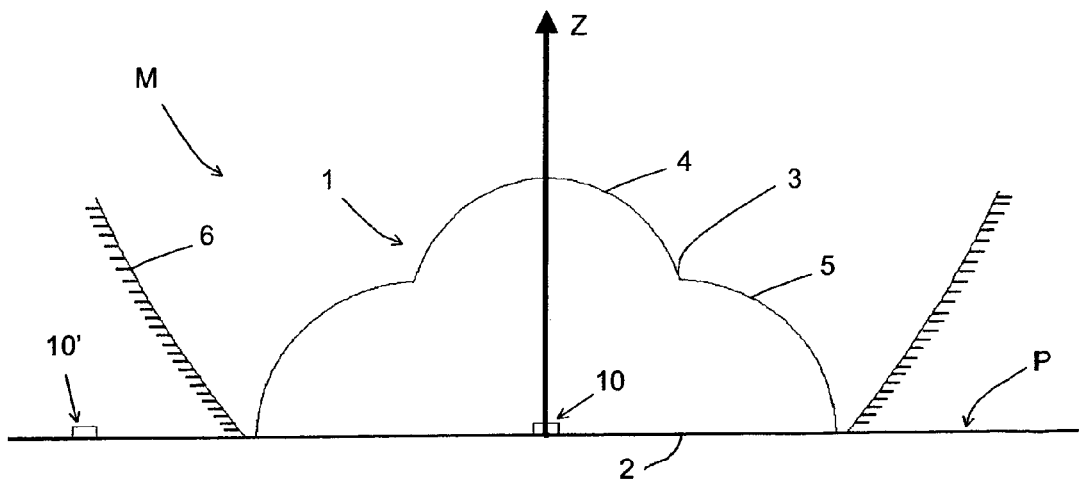
Figure 2C:
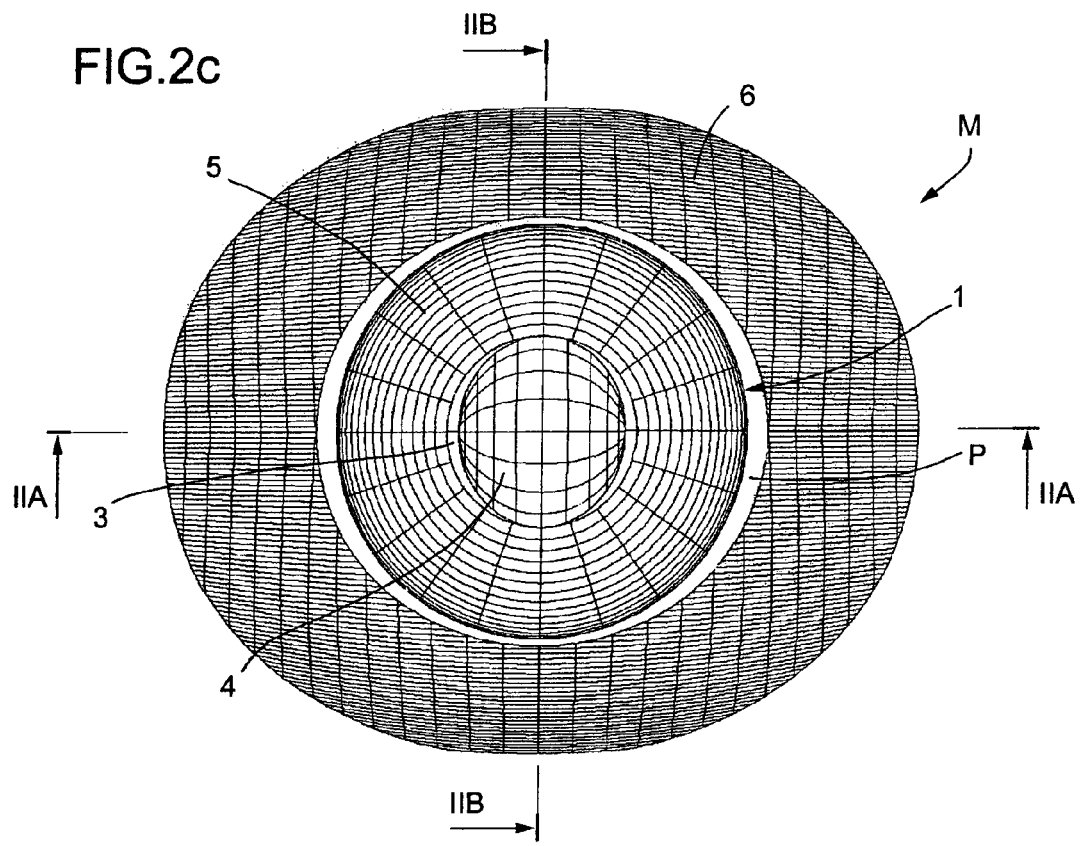
Figure 5A:
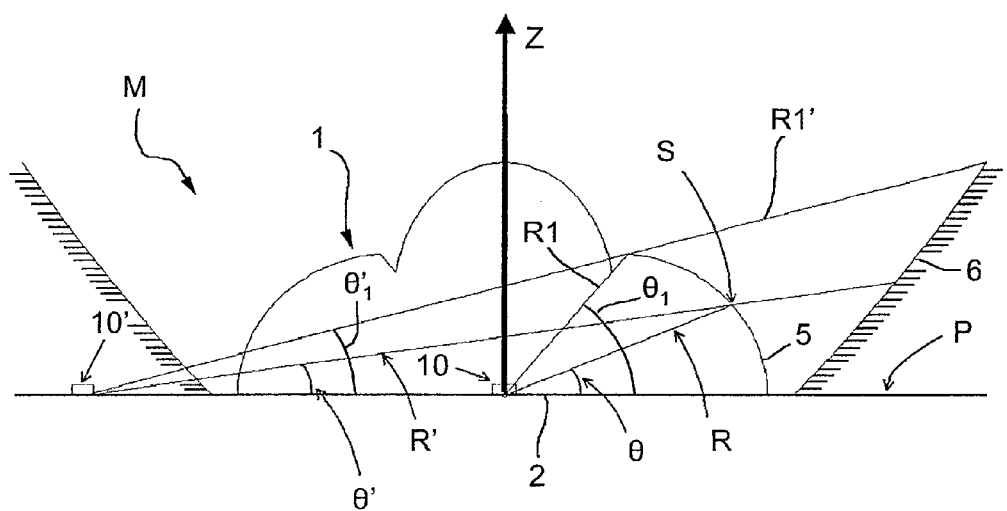
Figure 6B:
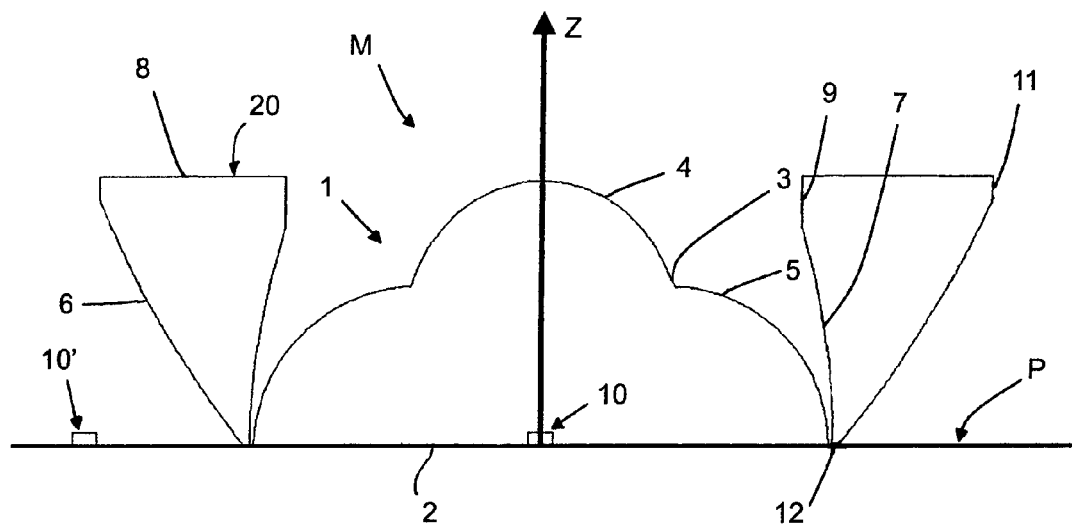
Figure 6A:
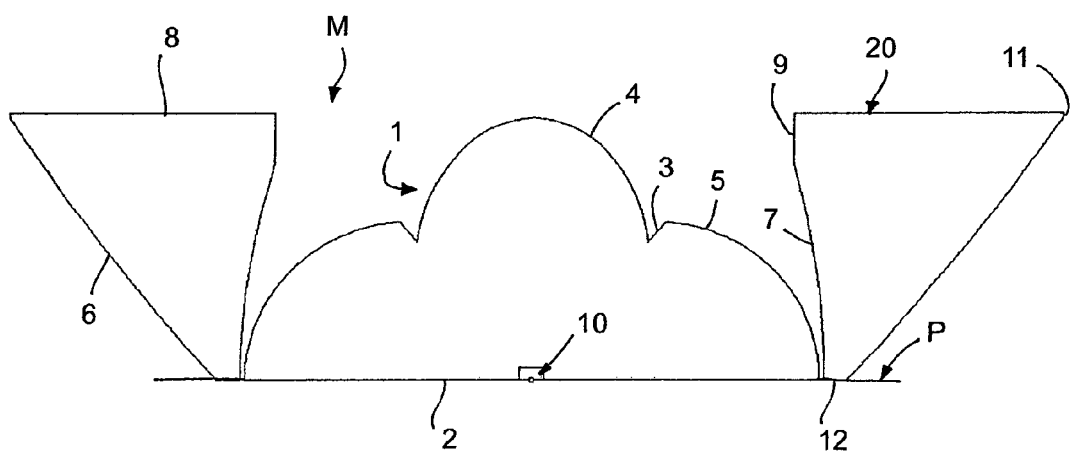
Figure 7:
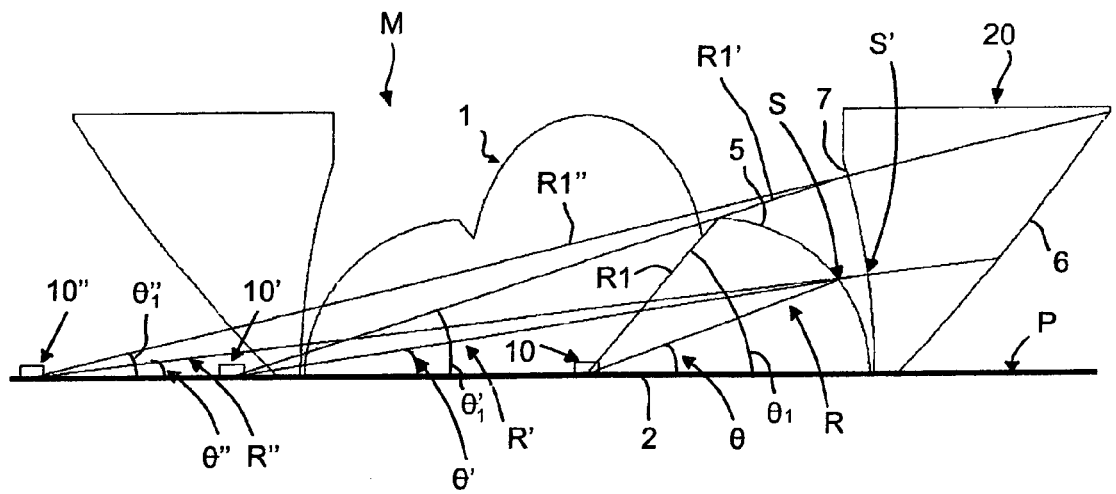
Figure 8:
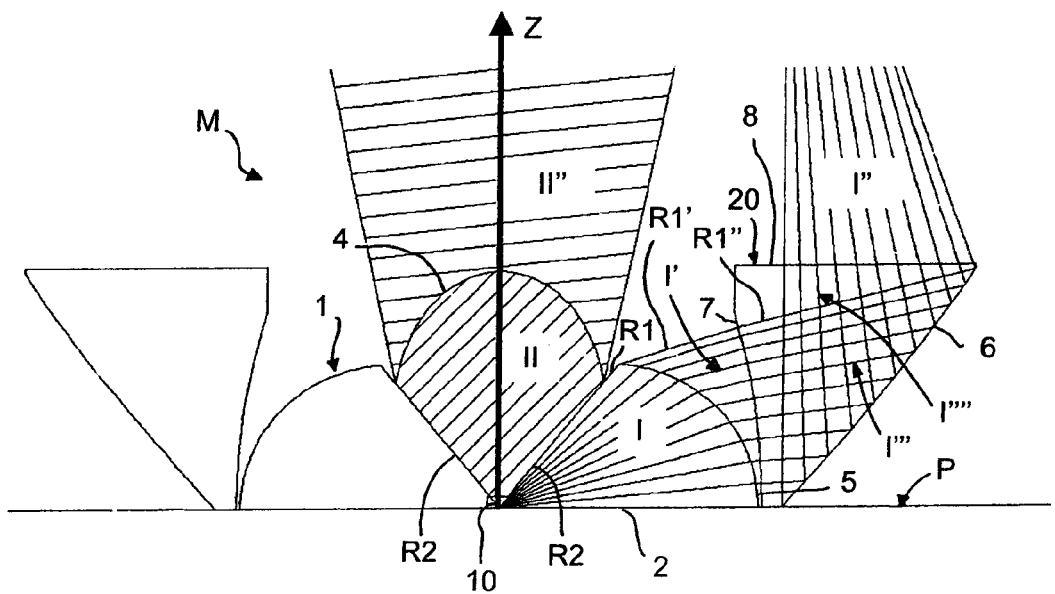
Figure 9:
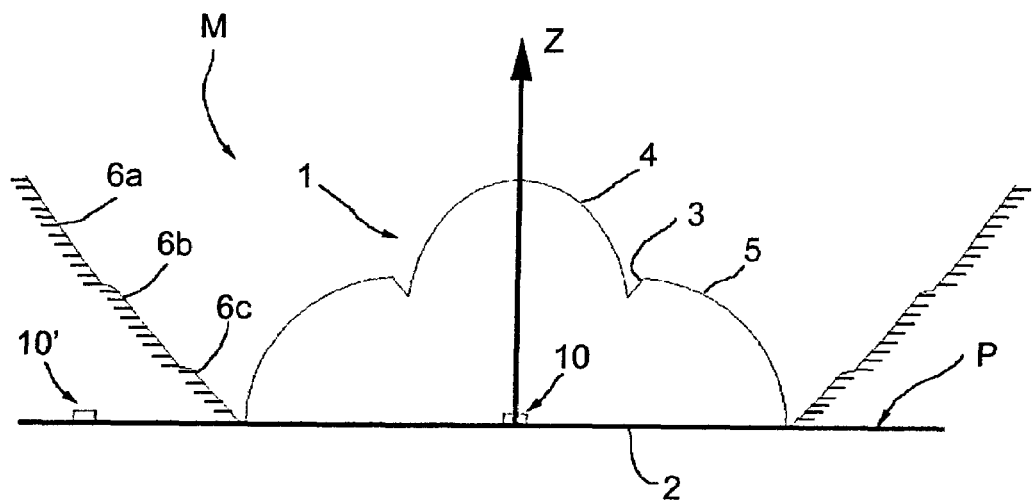
Figure 10:
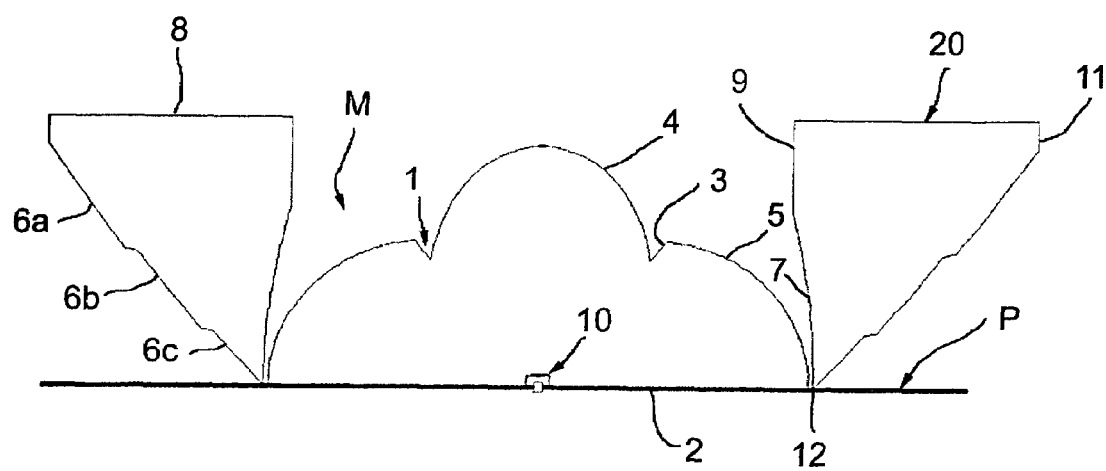
Figure 11:
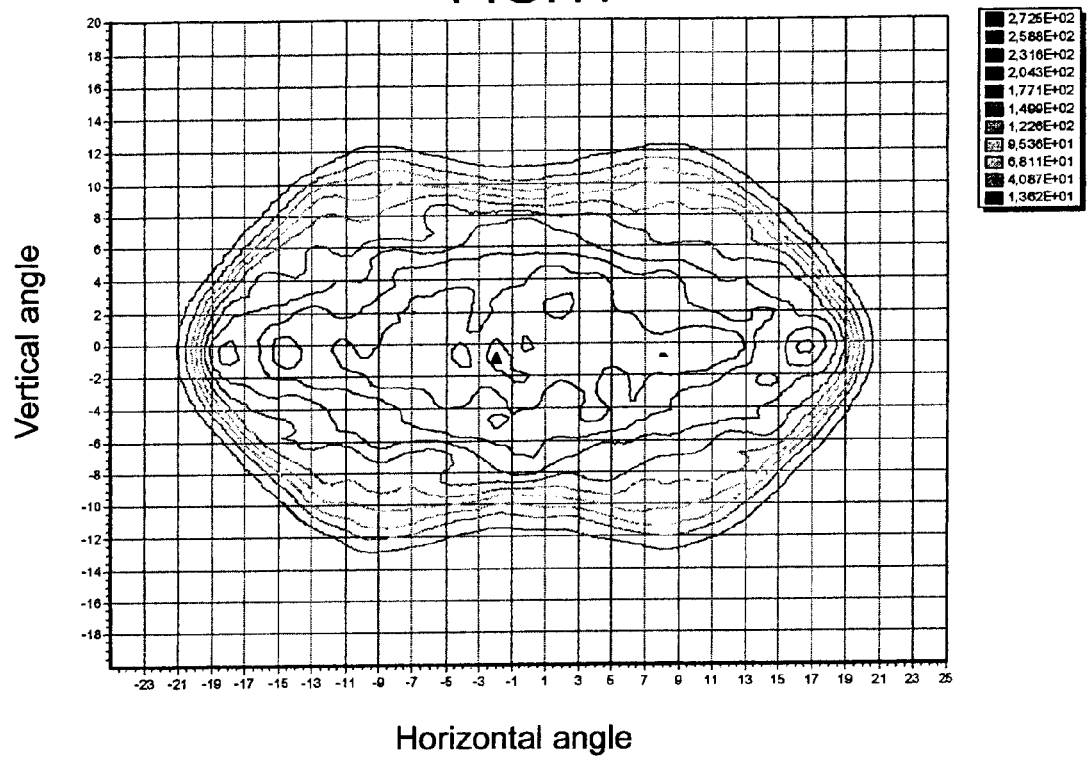
Figure 12:
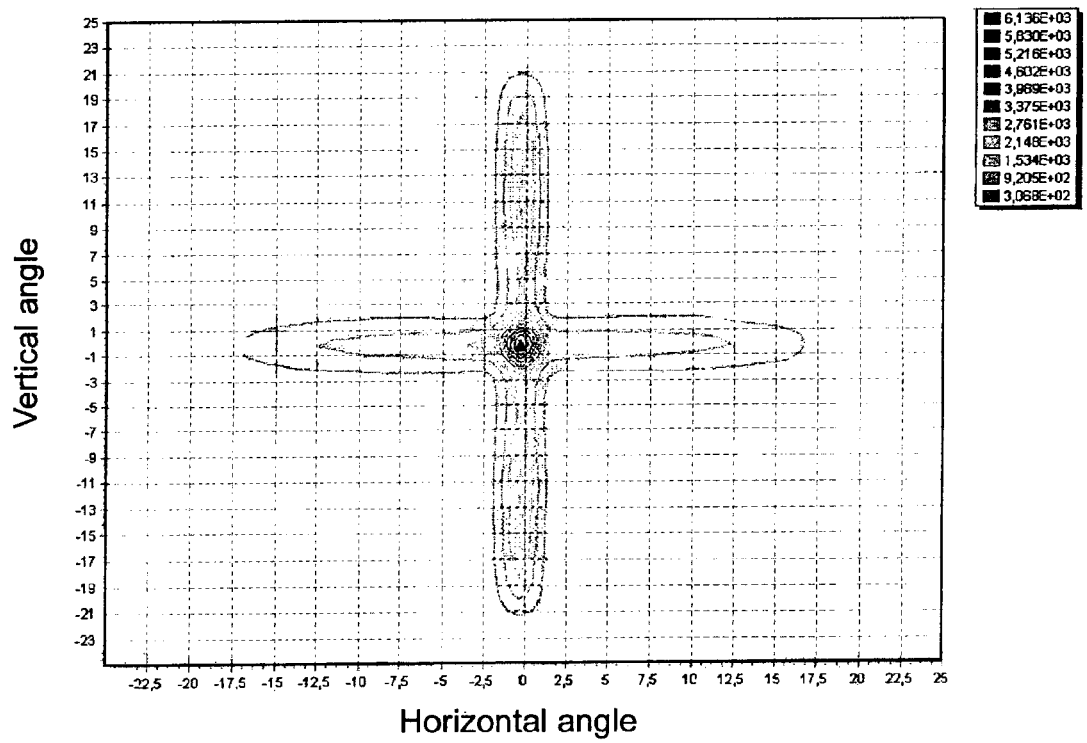
Figure 13:
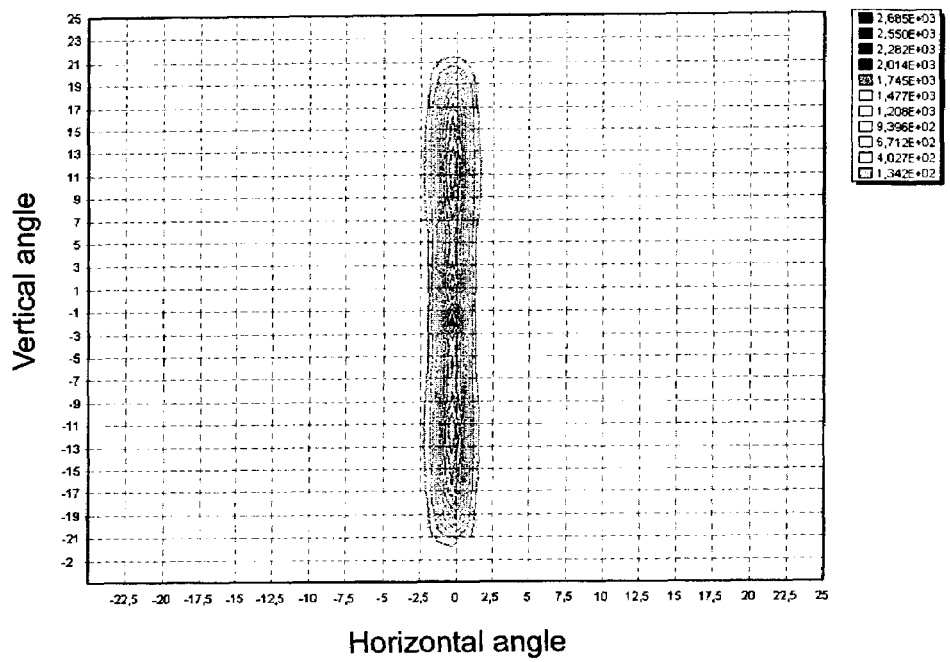
Figure 14:
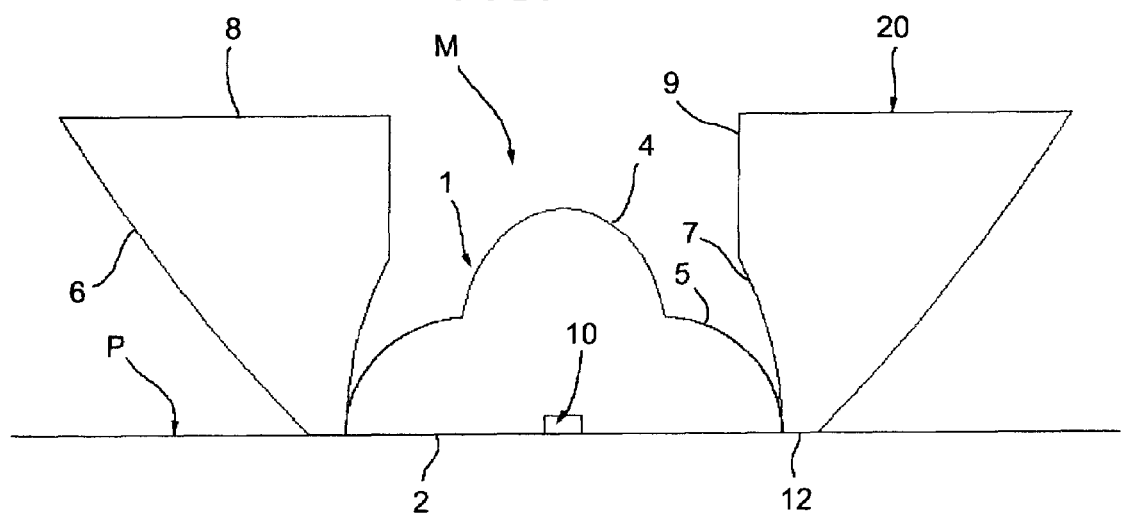
Figure 15:
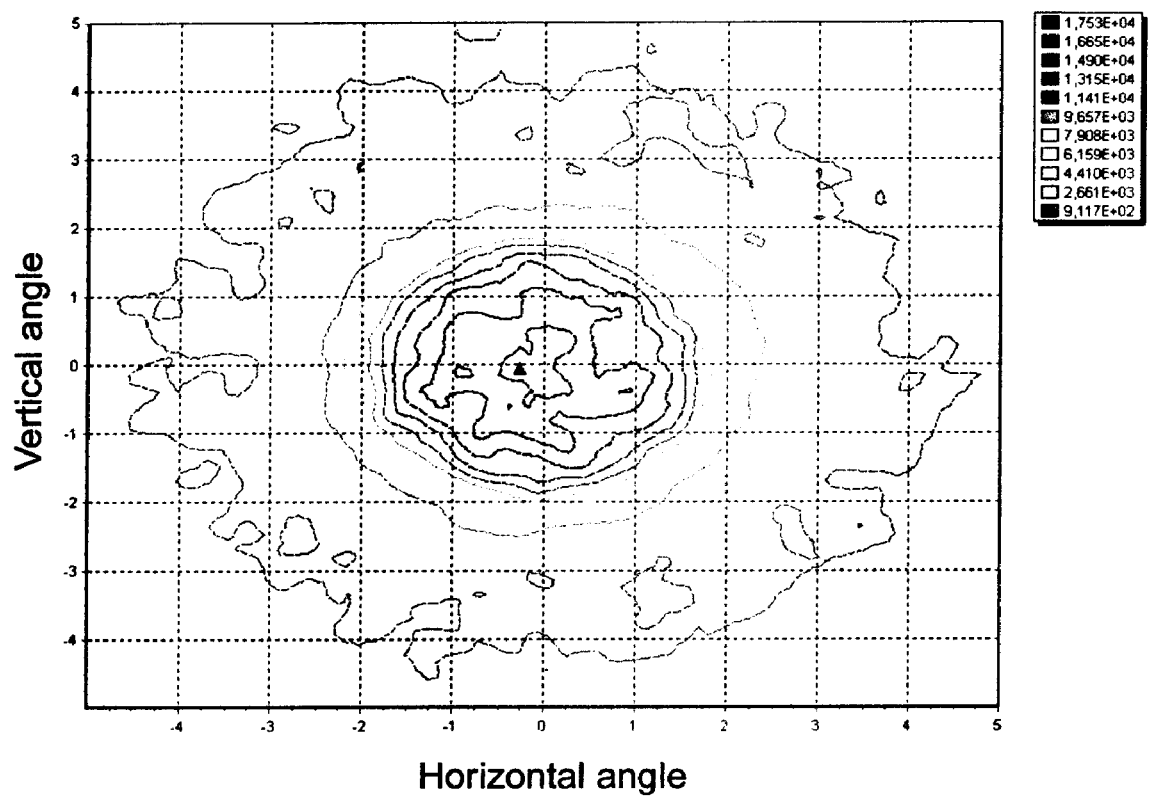
Figure 16:
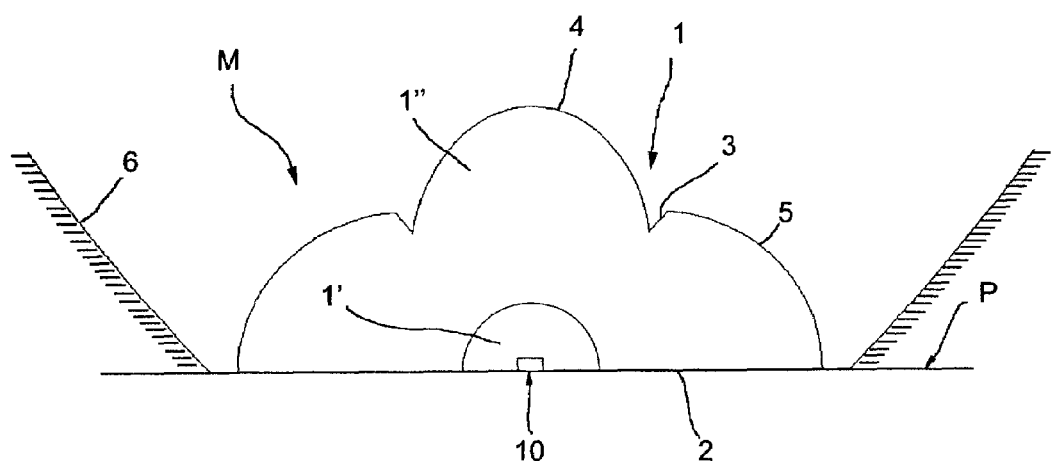
Figure 17:
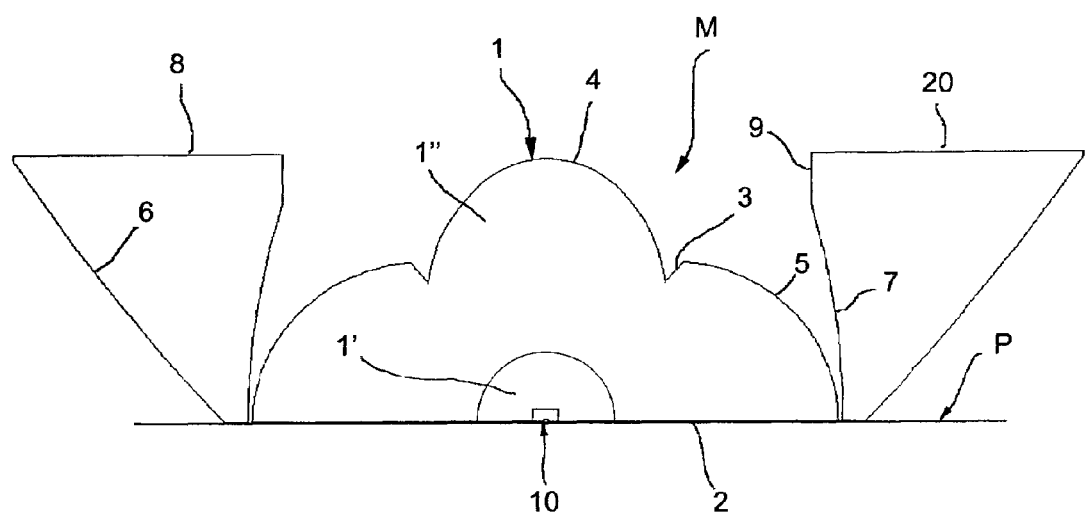
Figure 18:
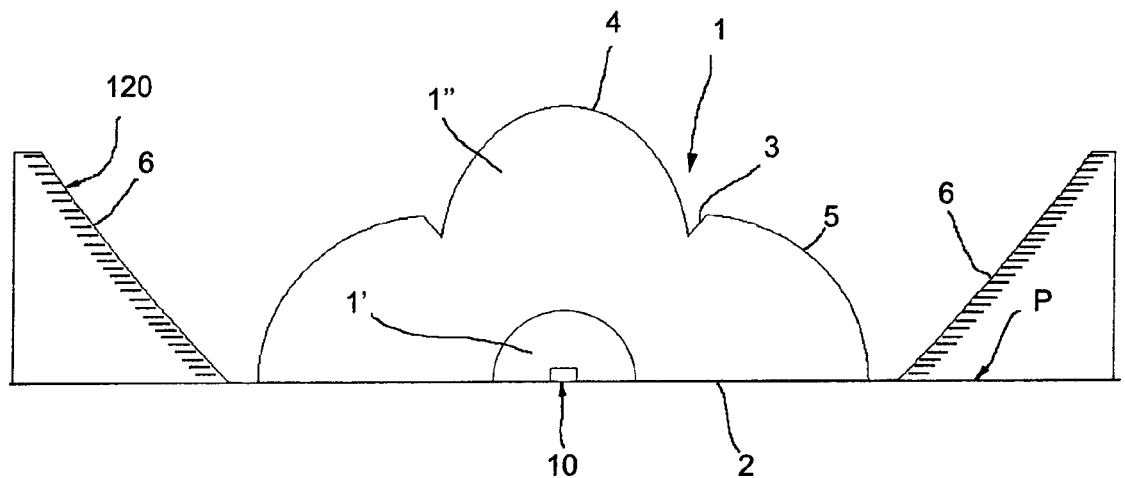
Figure 19:
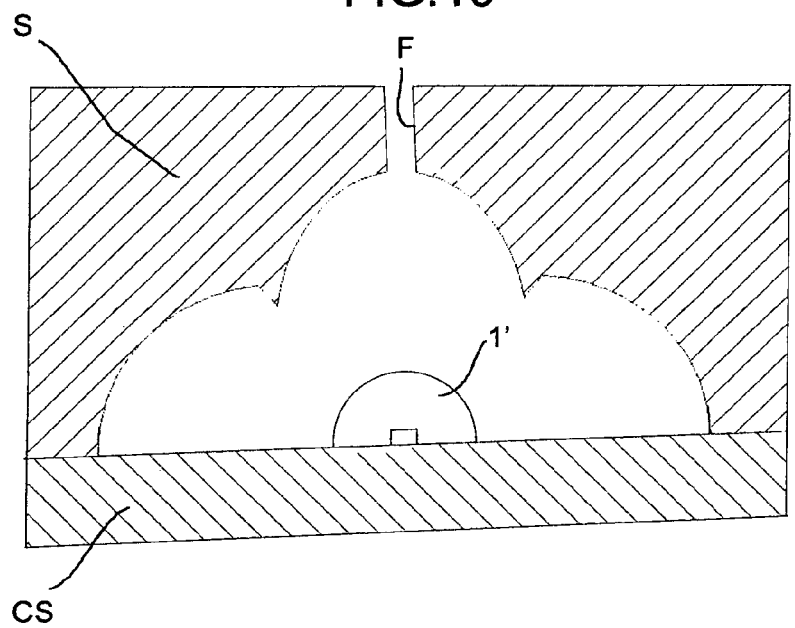
Figure 20:
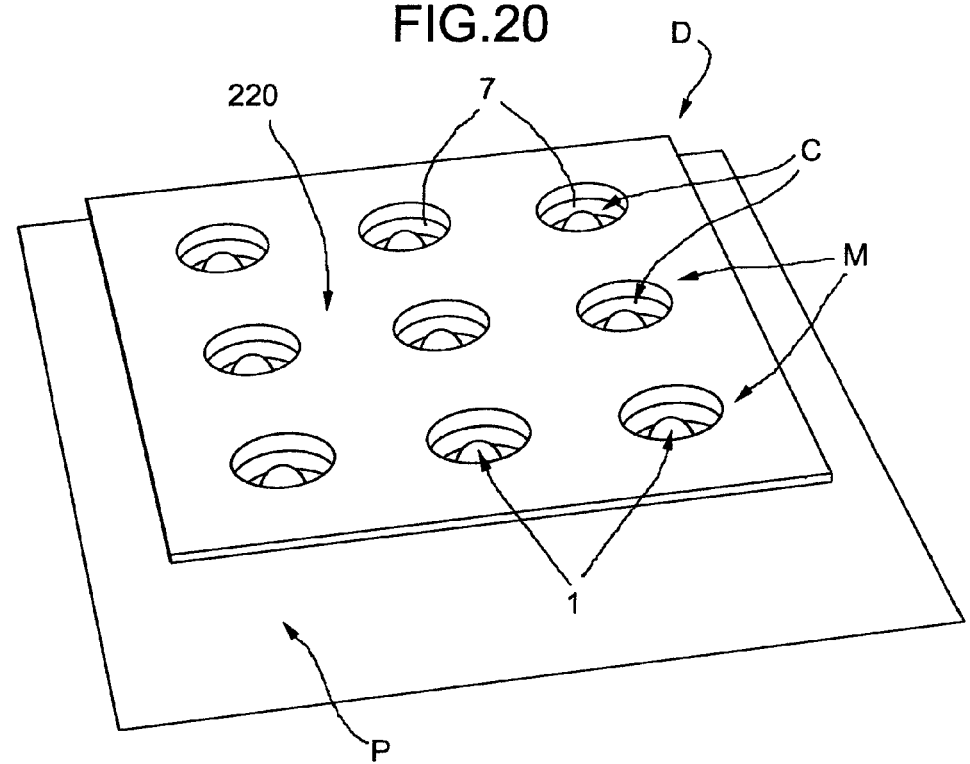
Figure 21:
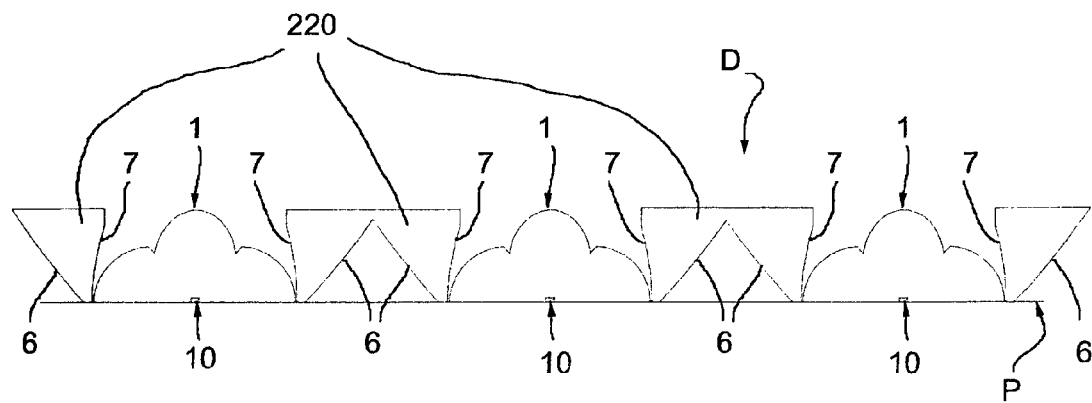

FIGS. 5a; 5b show the deflection of the rays as they pass through a surface of the optical module of FIG. 1 and the consequent creation of a virtual source;

FIGS. 6a,b show a variant of the module of FIG. 1 with surfaces which work by total internal reflection, in a view similar to that of FIGS. 2a, 2b;

FIG. 7 shows the deflection of the rays as they pass through a surface of the optical module of FIGS. 6a,b and the consequent creation of two virtual sources;

FIG. 8 shows the distribution of the light beams inside the module of FIGS. 6a,b;

FIG. 9 shows a further variant of the module of FIG. 1 having a segmented reflecting surface, in a view similar to that of FIG. 2a;

FIG. 10 shows a further variant of the module of FIGS. 6a,b having a segmented reflecting surface;

FIG. 11 shows a typical distribution of luminous intensity which can be produced by the optical module in the embodiments of FIG. 1-2, 4, 6, 9, 10, 16, 17 or 18;

FIG. 12 shows a possible distribution of luminous intensity produced by the optical module in the embodiments of FIG. 1-2, 4, 6, 9, 10, 16, 17 or 18;

FIG. 13 shows a further possible distribution of luminous intensity produced by the optical module in the embodiments of FIG. 1-2, 4, 6, 9, 10, 16, 17 or 18;

FIG. 14 shows a further variant of the module of FIGS. 6a,b obtained by symmetrical rotation, in a view similar to that of FIG. 2a;

FIG. 15 shows a typical distribution of luminous intensity produced by the optical module in the solution of FIG. 14;

FIG. 16 shows a further variant of the module of FIG. 1, having the volume of a central solid body divided into two distinct portions, in a view similar to that of FIG. 2a;

FIG. 17 shows a variant of the module of FIG. 16 having surfaces working by total internal reflection in a view similar to that of FIG. 2a;

FIG. 18 shows a further variant of the module of FIG. 1 in which a lateral reflecting body is formed as a solid body connected to the base and coated with a reflecting coating, in a view similar to that of FIG. 2a;

FIG. 19 shows a method for the injection co-moulding of a central solid body of the module according to the invention;

FIG. 20 shows a device formed by a plurality of modules of the invention;

FIG. 21 shows a portion of the device of FIG. 20 in which the modules work by total internal reflection; and FIG. 22 shows a portion of the device of FIG. 20 in which the modules work by means of a metal coating.

With reference to FIGS. 1 and 2a,b,c, a module M for projecting a light beam comprises a light source 10 suitable for being arranged on a support surface P, for example, a printed circuit, and an optical system suitable for conveying the light emitted by the source 10 in a direction substantially perpendicular to the support surface P. The optical system comprises a solid body 1 made of transparent material and a reflecting surface 6. If required, the module in question as a whole can shape the beam into a distribution of luminous intensity having different divergences in two directions which are perpendicular to each other and to the support surface, in any case minimizing the overall dimensions of the module.

The body 1 has a principal extension axis z which, in the mounted condition shown in FIGS. 2a and 2b, is substantially perpendicular to the support surface P.

With reference to FIGS. 2a and 2b, the light source 10, which is preferably of the solid-state type, rests on the support surface P of the body 1 and is sunk into a base surface 2 of the solid body 1 which also rests on the support surface P. Technologically, the solid-state source may be integrated in the module M by chip-on-board (COB) technology. This technology differs from the SMD (Surface Mounted Device) technology in the use of the semiconductor directly on the printed circuit instead of discrete components within the plastics housing, that is, the LED is composed purely of the semiconductor element (the die) glued to the supporting board P by a drop of conductive paste. The main advantage of COB technology is that very thin optical devices can be produced precisely because the entire packaging typical of an LED is eliminated.

As is known, LED sources can be integrated directly on a printed circuit in the form of "chips" or "dies" (multi-layer semiconductor elements which emit luminous radiation when supplied with energy). Some possible applications are luminous indicating devices, motor-vehicle headlamps or lights, public information devices, etc.

The technique for the production of these devices goes by the name of COB (Chip-On-Board) technology and consists in mounting chip-LED matrices directly on a suitable substrate. This technology comprises firstly the process known by the term "die-bonding" (thermal connection or electro-thermal connection of the die to the substrate) with which optional "wire-bonding" operations (electrical connection of the chip to the circuit) are associated. Amongst the "die-bonding" techniques, the "flip-chip" method provides for inversion of the chip and electro-thermal connection of its pads to the circuit without the use of wires for the electrical connection, thus excluding a further "wire-bonding" process. In the "flip-chip" process, the connections of the pads are typically formed by means of metal "bumps" (spheres). As a final step, the COB process provides for "encapsulation" or protection of the source from external stresses with suitable resins.

Figure 3:
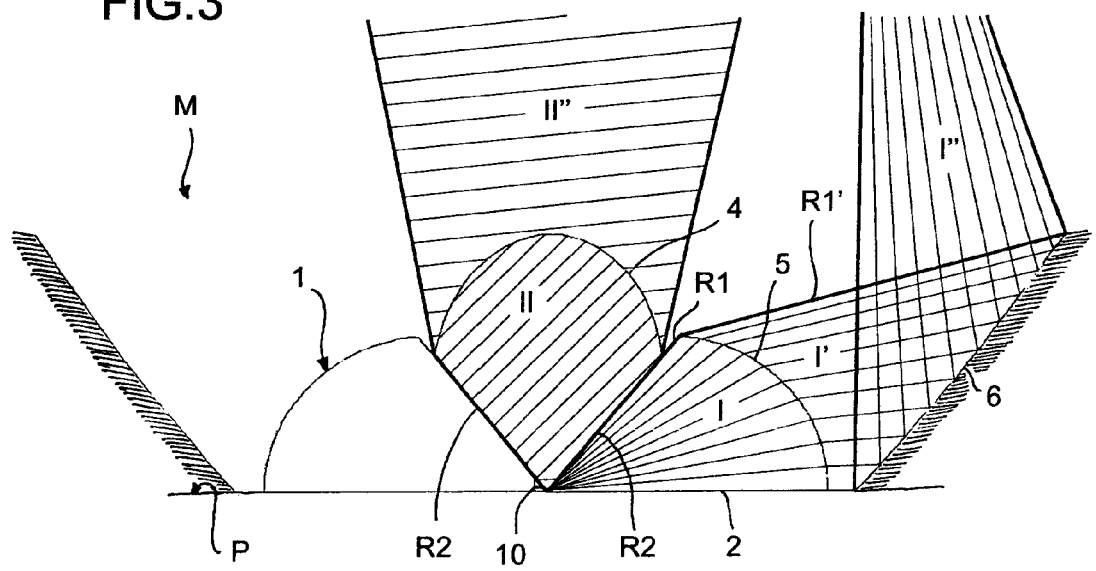
FIG. 3 shows the distribution of the light beams inside the module of FIG. 1.

With reference to FIG. 3, the optical system operates separately on two portions of the luminous flux emitted, that is, by transmission on the central portion and by transmission and subsequent reflection on the peripheral portion. This reflection may be achieved by means of a reflecting metal layer or by total internal reflection (TIR). Clear separation of the functions of the optical system involves the need to divide the luminous flux emitted by the source 10 into two parts I and II.

The separation of the luminous flux emitted by the LED source 10 into two distinct, peripheral and central light beams, I and II, respectively, takes place inside the transparent body 1. The body 1 comprises a central surface 4 which collects the central portion II of the luminous flux coming from the source 10 and an annular surface 5 which collects the peripheral portion I of the luminous flux coming from the source 10. The fact that the two light beams I and II are kept separate prevents any region of the device having to work for both beams, and hence in an approximate manner, thus significantly reducing the overall efficiency of the module. To ensure that the luminous flux is separated correctly, it is important to calculate the meeting point between the central surface 4 and the annular surface 5; in fact the meeting point of the two interfaces determines, according to Snell's law, the extremal rays R1 and R2 beyond which the two beams I and II cannot go, as shown in FIG. 3. The beams I and II are thus rendered independent of one another and the design of the transmission portion can be separated and univocally dealt with respect to that of the portion which works by reflection.

The flux II which is emitted by the source 10 and is collected by the central surface 4 is shaped by the latter into a predetermined distribution of luminous intensity II" about the principal axis z.

The central surface 4 is generally rotationally asymmetrical and, by way of example, may be designed so as to form a substantially uniform and rectangular distribution of luminous intensity II'. In FIGS. 2a, b and c it can be seen that, if the body 1 is rotated through 90° about the principal axis z, the central surface 4 has a different cross-section.

Figure 4:
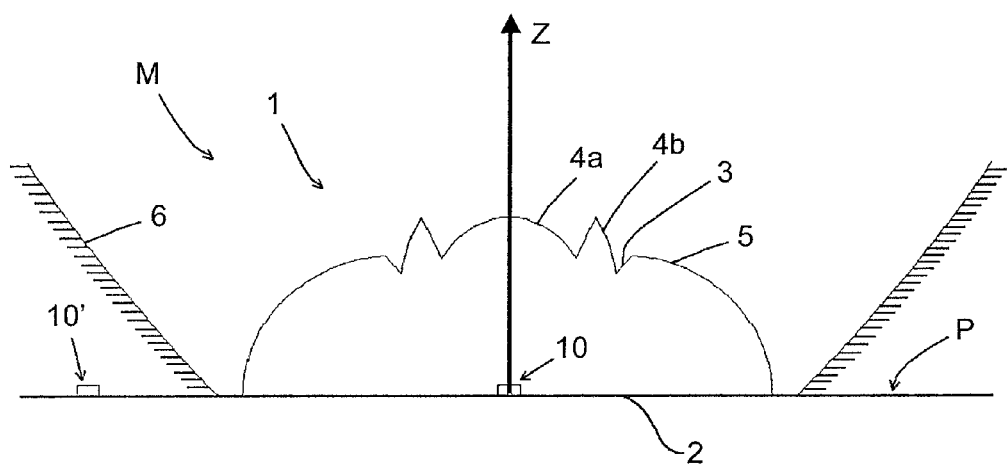

In a variant of the device M shown in FIG. 4, the central surface 4 may be segmented into several portions 4a,b in order further to reduce the thickness of the central portion of the body 1.

If the portion II of the light beam is not rotationally symmetrical, the transparent body 1 may have a connecting surface 3 which connects the central surface 4 to the annular surface 5. The substantially conical connecting surface 3 is designed so as not to interfere with the light emerging at large angles from the central surface 4, and does not therefore reduce the overall efficiency of the module since the extent to which the light reaches it is almost zero.

The annular surface 5 is preferably produced by rotation with an axis coinciding with the axis z perpendicular to the support surface P and extending through the centre of the source 10. Each section of the annular surface 5 has substantially an aspherical lens profile and is constructed so that the rays which are generated by the source 10 and which fall on that section of the annular surface 5 produce a single virtual point-like source 10' on the flat section of the device shown in FIGS. 5a and 5b. The annular surface 5 as a whole thus produces a virtual image of the source 10 having a substantially annular shape.

Figure 5B:
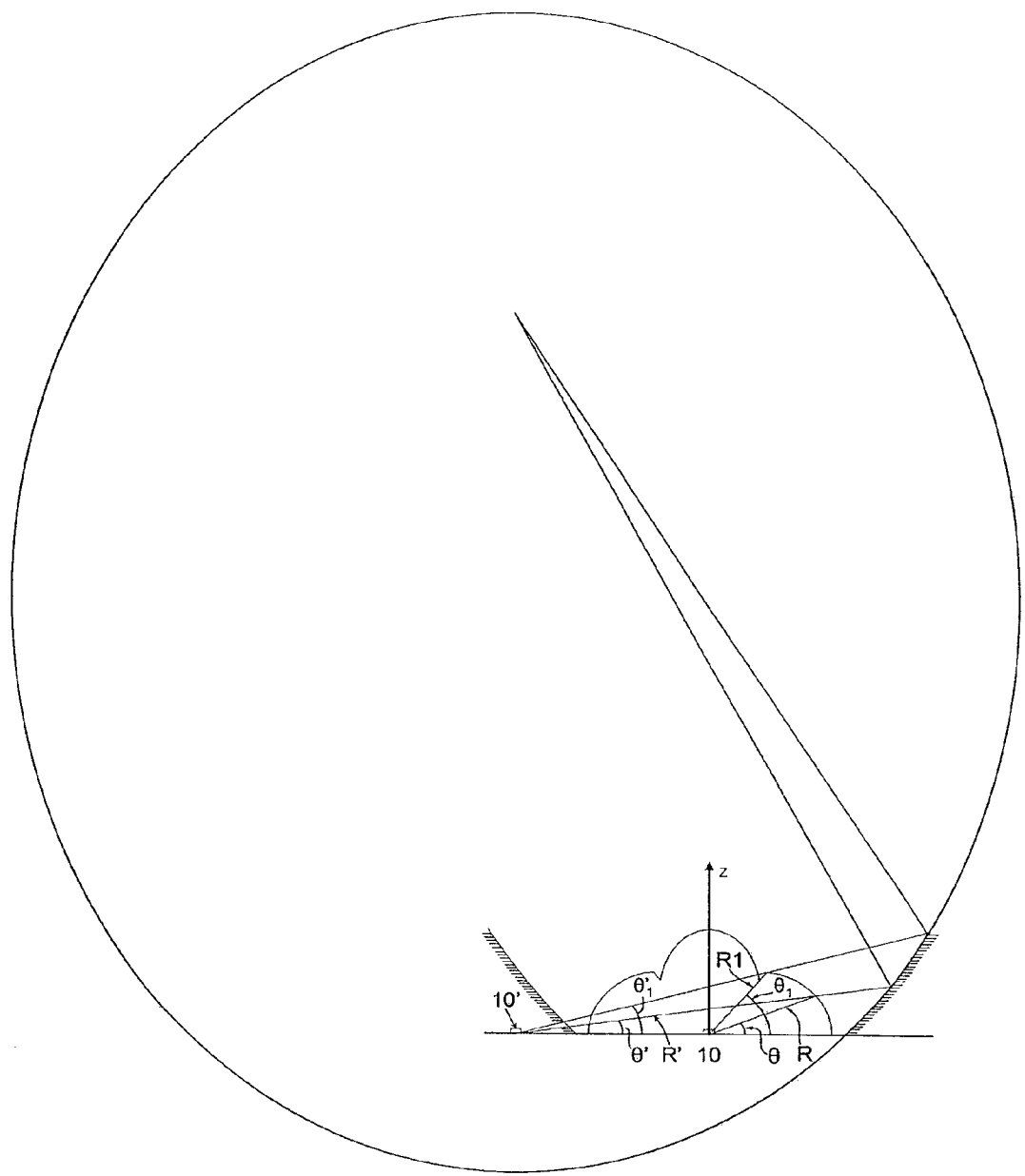

With reference to FIGS. 5a and 5b, the angle subtended between the support surface P of the optical system and a generic ray R coming from the source 10 and falling on the annular surface 5 at a generic point S is defined as $\theta$. Moreover, the angle subtended between the base surface 2 (that is, the support surface P) and the ray R' coming from the virtual source 10' as a result of the refraction brought about at the point 5 of the annular surface 5 is defined as $\theta'$. The annular surface 5 is designed in a manner such that each angle $\theta$ subtended by any ray R coming from the source 10 is greater than or equal to its corresponding angle $\theta'$ subtended by the corresponding ray R' which is produced as f result of the refraction brought about at the point S of the annular surface 5. In other words, if the angles $\theta_1$ and $\theta_{1'}$ subtended by the extremal rays R1, R1' before and after refraction on the annular surface 5, respectively, are defined as the angles subtended by the peripheral portion of the light beam before and after refraction on the annular surface 5, respectively, the angle $\theta_{1'}$ subtended by the peripheral portion I' of the light beam after refraction on the annular surface 5 is equal to or less than the angle $\theta_1$ subtended by the peripheral portion I of the light beam before refraction on the annular surface 5. This condition enables the vertical dimensions of the module to be reduced whilst maintaining the same overall luminous efficiency.

The reflecting surface 6 has a substantially annular shape, viewed in plan, and extends around the transparent body 1. The reflecting surface 6 may have the overall shape, for example, of a paraboloid, an ellipsoid, or a hyperboloid of revolution about the principal axis z. In other cases, the reflecting surface 6 may have not any rotational symmetry. To arrange for the peripheral light beam to be controlled and to succeed in directing the light in the desired direction, one of the two foci of the ellipsoid, or the focus of the paraboloid is made to coincide substantially with the virtual source 10'.

The reflecting surface 6 may be formed in a body (not shown) distinct from the transparent body 1, for example, by coating with a layer of reflecting material. In a preferred embodiment, shown in FIGS. 6a and 6b which show two cross-sections of the same module which is not produced by symmetrical rotation, it forms part of an auxiliary solid transparent body 20 having a substantially annular shape. In the specific embodiment, the auxiliary body 20 has a radially inner annular surface 7 which is connected to the reflecting surface 6 by means of an annular base surface 12 and is limited at the top by an annular top surface 8. The annular top surface 8 is connected to the reflecting surface 6 by means of a radially outer surface 11 having a substantially cylindrical shape, and is connected to the radially inner annular surface 7 by means of a radially inner surface 9 having a substantially cylindrical shape. If it is decided to group a plurality of modules M together to produce an optical device D, the radially outer surface 11 has the function of connecting the adjacent modules to one another as shown in FIG. 20.

Each section of the radially inner annular surface 7 of the auxiliary body 20 is constructed in a manner such that the rays which come from the source 10' and fall on that section of the annular surface 7 give rise to a single virtual point-like source 10", as shown in FIG. 7. The radially inner annular surface 7 as a whole therefore produces a virtual image of the source 10' having a substantially annular shape. With reference to FIG. 7, the angle subtended between the base surface 2 of the main body 1 (that is, the support surface P) and a generic ray R" emerging from the virtual source 10" and falling on the radially inner annular surface 7 of the auxiliary body 20 at a generic point S' is defined as $\theta"$. The radially inner annular surface 7 is designed in a manner such that each angle $\theta'$ subtended by any ray R' coming from the virtual source 10' is greater than or equal to its corresponding angle $\theta"$ subtended by the corresponding ray R" as a result of the refraction brought about by the annular surface 7. In other words, if the angles $\theta_1'$ and $\theta_1"$ subtended by the extremal ray R1', R1" before and after refraction on the radially inner annular surface 7, respectively, are defined as the angles subtended by the peripheral portion of the light beam before and after refraction on the radially peripheral annular surface 7, respectively, the angle $\theta_1"$ subtended by the peripheral portion I''' of the light beam after refraction on the radially inner annular surface 7 is equal to or less than the angle $\theta_1'$ subtended by the peripheral portion I' of the light beam before refraction on the radially inner annular surface 7. This condition enables the vertical dimensions of the module M to be reduced to a greater extent than the solution shown in FIGS. 1 to 5 in which the reflecting surface 6 receives the light beam refracted by the annular surface 5 of the main body 1 directly, that is, without intermediate dioptric surfaces.

If the auxiliary transparent body 20 is used and the reflecting surface 6 is constructed as an ellipsoid or a hyperboloid or, in suitable conditions, a paraboloid, it is possible to obtain the reflection of the light beam by means of total internal reflection; it is therefore unnecessary to coat the reflecting surface 6 with a metal layer to achieve reflection of the incident beam I'''. This results in a constructional simplification and a considerable reduction in costs and, above all, the losses in efficiency which such a coating introduces do not arise.

With reference to FIG. 8, the reflecting surface 6 collects the flux I''' coming from the radially inner annular surface 7 and shapes the flux I''' into a predetermined distribution of luminous intensity I'''' about the principal axis z. Finally, the annular top surface 8 collects the flux I'''' coming from the reflecting surface 6 and extracts it from the auxiliary transparent body 20 as indicated by I'', thus bringing about a further refraction.

The reflecting surface 6 may be continuous or may be divided into segments 6a, 6b, 6c. This is shown in FIGS. 9 and 10 which show the segmented surface 6 formed in the embodiment without an auxiliary transparent body 20 and in the embodiment which uses the auxiliary transparent body 20 and total internal reflection, respectively.

The reflecting surface 6 may be rotationally asymmetrical with respect to the principal axis z extending through the centre of the source 10 and its geometry may vary from zone to zone in dependence on the distribution of luminous intensity to be achieved.

FIGS. 11, 12 and 13 show various possible distributions of luminous intensity obtained with a module M according to the invention. Since the fluxes I and II are generally shaped so as to have different divergences in two directions which are perpendicular to one another and to the support surface, it is possible to construct different distributions of luminous intensity. FIGS. 11 and 13 are achieved by superimposing the contributions of the luminous fluxes I and II and arranging for the divergences of those fluxes to be in phase with one another. FIG. 12 is obtained by arranging for the divergences of the fluxes I and II to be out of phase by 180 degrees. The drawings show distributions of luminous intensity expressed in candelas (cd).

FIG. 14 shows a solution in which the distribution of luminous intensity has substantial collimation with respect to the principal axis z. In this case, in which all of the surfaces of the optical system are produced by symmetrical rotation about the principal axis z, the reflecting surface 6 has a parabolic cross-section with its focus centred on the virtual source 10', or 10'' if the auxiliary solid body 20 is present, and the central surface 4 has a substantially elliptical cross-section with its focus farther from the central surface 4, coinciding with the source 10. The distribution of luminous intensity obtained with the device of FIG. 14 is shown in FIG. 15.

The main solid body 1 may be produced by various moulding techniques and with different plastics resins. By way of example, thermo-setting or photo-polymerizable resins may be used; these resins may be epoxy, silicone or acrylic resins. The solid body may be produced by moulding, for example, by injection moulding or casting.

With reference to FIGS. 16 and 17, the main solid body 1 may be produced in two successive steps so as to comprise a first portion and a second portion 1' and 1'', respectively, optionally made of different materials. The source 10 may be incorporated in the first portion 1' of the solid body 1, which is made of thermosetting or epoxy resin. The second portion 1'' of the solid body 1 is then added by moulding over the first and incorporates the first portion 1' of the solid body 1, adopting the shape of the solid body 1 externally. FIG. 19 shows a possible technique for the co-moulding of the second portion 1'' of the solid body 1 onto the first portion of the body 1 with the use of a mould S having a central hole F for the injection of the plastics resin and a counter-mould CS on which the first portion 1' of the solid body 1 is disposed.

With reference to FIG. 18, the reflecting surface 6 may be formed on an auxiliary solid body 120 which is connected to the surface P and subsequently coated with a metal coating. In this configuration, the auxiliary body 120 and the main body 1'' may be moulded simultaneously, for example, by injection moulding; in this case, the auxiliary body 120 is also transparent and is subsequently coated with a reflecting metal coating.

With reference to FIGS. 20 to 22, an optical device D can be produced with the use of a plurality of optical modules M of the invention. In this case, the auxiliary transparent bodies 20 or 120 of each module M are connected to one another to form a single, combined transparent body 220 in which a plurality of cavities C are formed. The main body 1 of the respective module M is disposed in each cavity C. In particular, FIG. 21 shows a device D which uses total internal reflection, in which the corresponding radially inner annular surface 7 is formed on the lateral surface of each cavity C (the reflecting surfaces 6 are not visible in FIG. 20) whereas FIG. 22 shows a device which needs a metal coating on the lateral surfaces of the cavities C to form the reflecting surfaces 6.

The combined transparent body 220 may be produced by various moulding techniques and with different plastics resins. By way of example, thermo-setting or photopolymerizable resins may be used; the resins may be epoxy, silicone or acrylic resins. The combined solid body 220 may be produced by moulding, for example, injection moulding or casting. In particular, the combined solid body 220 of the device of FIG. 21 may be moulded simultaneously with the plurality of main solid bodies 1.

What is claimed is:

1. An optical module for projecting a light beam, comprising a light source;

a main solid body of transparent material having a principal extension axis, the body having a base surface which is flat and perpendicular to the principal extension axis and in which the light source is included and, on the opposite side with respect to the principal extension axis, a central surface and an annular surface extending around the central surface, the central and annular surfaces being suitable for receiving a central portion and a peripheral portion, respectively, of a luminous flux emitted by the source, and a reflecting surface having an annular shape whose cross-section is a conic section, the reflecting surface being arranged around the solid body;

wherein the central surface is designed so as to shape the central portion of the luminous flux into a predetermined distribution of luminous intensity about the principal axis;

the annular surface is designed so as to produce a virtual image of the light source, said virtual image of the light source having a substantially annular shape with a point-like cross-section, said annular surface being further designed to transmit the peripheral portion of the light beam in a manner such that an angle θ1' subtended by the peripheral portion of the light beam after refraction on the annular surface is equal to or less than an angle θ1 subtended by the peripheral portion of the light beam before refraction on the annular surface, and the reflecting surface has a focal line, said focal line and said virtual image of the light source being coincident, the reflecting surface being designed in a manner such as to reflect the peripheral portion of the luminous flux transmitted by the annular surface and to shape it into a predetermined distribution of luminous intensity about the principal axis.

2. An optical module according to claim 1, in which the annular surface is of substantially aspherical shape.

3. An optical module according to claim 1, in which the central, annular and reflecting surfaces are obtained by symmetrical rotation with respect to the principal axis.

4. An optical module according to claim 3, in which the reflecting surface is formed on an auxiliary transparent body having a principal axis coinciding with the principal axis, the auxiliary transparent body having a radially inner annular surface which faces the annular surface of the main transparent body and which is connected to the reflecting surface by means of a substantially flat annular base surface perpendicular to the principal axis, in which the auxiliary transparent body also has a substantially flat annular top surface perpendicular to the principal axis and a substantially cylindrical radially inner connecting surface which connects the annular top surface to the radially inner annular surface, in which the annular top surface, the radially inner connecting surface, and the annular base surface are obtained by symmetrical rotation with respect to the principal axis.

5. An optical module according to claim 1, in which the central surface has an optical axis coinciding with the principal extension axis and is rotationally non-symmetrical with respect to the principal axis.

6. An optical module according to claim 5, in which the central surface is connected to the annular surface by means of a substantially conical connecting surface.

7. An optical module according to claim 5, in which the central surface can produce a substantially uniform distribution of luminous intensity of rectangular shape in a plane perpendicular to the principal axis.

8. An optical module according to claim 5, in which the central surface is segmented.

9. An optical module according to claim 5, in which the reflecting surface is rotationally non-symmetrical with respect to the principal axis.

10. An optical module according to claim 9, in which the reflecting surface, in cooperation with the annular surface, can produce a substantially uniform distribution of luminous intensity of rectangular shape in a plane perpendicular to the principal axis.

11. An optical module according to claim 1, in which the reflecting surface is formed on an auxiliary transparent body having a principal axis coinciding with the principal axis.

12. An optical module according to claim 11, in which the auxiliary transparent body has a radially inner annular surface which faces the annular surface of the main transparent body and which is connected to the reflecting surface by means of a substantially flat annular base surface perpendicular to the principal axis.

13. An optical module according to claim 12, in which the radially inner annular surface is designed in a manner such as to produce a secondary virtual image of the light source having a substantially annular shape, and to transmit the peripheral portion of the light beam in a manner such that the angle θ1" subtended by the peripheral portion of the light beam after refraction on the radially inner annular surface is equal to or less than the angle θ1' subtended by the peripheral portion of the light beam before refraction on the radially inner annular surface.

14. An optical module according to claim 13, in which the radially inner annular surface is substantially aspherical with the origin of the luminous flux fixed in the secondary virtual source.

15. An optical module according to claim 12, in which the auxiliary transparent body also has a substantially flat annular top surface perpendicular to the principal axis and a substantially cylindrical radially inner connecting surface which connects the annular top surface to the radially inner annular surface, in which the annular top surface, the radially inner connecting surface, and the annular base surface are obtained by symmetrical rotation with respect to the principal axis.

16. An optical module according to claim 11, in which the auxiliary transparent body has a substantially flat annular top surface perpendicular to the axis, the annular surface, in cooperation with the reflecting surface, being able to produce a substantially uniform distribution of luminous intensity of rectangular shape in a plane perpendicular to the principal axis.

17. An optical module according to claim 11, in which the auxiliary solid body is produced by injection molding of thermoplastic material simultaneously with the second portion of the main solid body.

18. An optical module according to claim 17, in which the reflecting surface of the auxiliary solid body has a reflecting coating.

19. An optical module according to claim 11, in which the auxiliary solid body is produced by injection molding of thermoplastic material and is connected to the main solid body.

20. An optical device having a luminous indicating function, comprising a plurality of modules according to claim 11, the modules being arranged on a shared support surface and electrically connected by means of conductive tracks formed on the support surface, in which the modules comprise respective auxiliary bodies which are connected to one another to form a single, combined transparent body.

21. An optical device according to claim 20, in which the combined transparent body is produced by injection molding of thermoplastic material and is coupled with the main solid bodies belonging to the plurality of modules.

22. An optical device according to claim 21, in which a portion of the combined transparent body is coated with a reflecting layer.

23. An optical device according to claim 20, in which a portion of the combined transparent body is coated with a reflecting layer.

24. An optical module according to claim 1, in which the reflecting surface is segmented into a plurality of reflecting portions.

25. An optical module according to claim 24, in which the reflecting portions are formed as substantially ellipsoid or paraboloid surfaces.

26. An optical module according to claim 1, designed in a manner such as to project a light beam with an overall distribution of intensity having substantially zero divergence from the principal axis.

27. An optical module according to claim 1, in which the reflecting surface has a reflecting coating.

28. An optical module according to claim 1, in which the reflecting surface can reflect the light by total internal reflection.

29. An optical module according to claim 1, in which the source is a solid-state source.

30. An optical module according to claim 29, in which the source is an LED having an emitter of rectangular or square shape and an emission axis oriented perpendicularly to the base surface.

31. An optical module according to claim 29, in which the source is integrated on the base surface by Chip On Board technology.

32. An optical module according to claim 31, in which the main solid body is made of thermosetting or photopolymerizable resin.

33. An optical module according to claim 32, in which the main solid body is made of epoxy, silicone or acrylic resin.

34. An optical module according to claim 32, in which the solid body is produced by molding of the casting type.

35. An optical module according to claim 31, in which the main solid body is formed in two distinct portions comprising
 a first portion which is in contact with the light source and is made of thermosetting or photopolymerized resin, and
 a second portion which is co-molded onto the first portion and is made of thermoplastic material.

36. An optical module according to claim 35, in which the second portion is produced by injection molding.

37. An optical module according to claim 35, in which the auxiliary solid body is produced by injection molding of thermoplastic material simultaneously with the second portion of the main solid body.

38. An optical device having a luminous indicating function, comprising a plurality of modules according to claim 1, the modules being arranged on a shared support surface and electrically connected by means of conductive tracks formed on the support surface.

39. An optical device according to claim 38, in which the respective auxiliary bodies making up the plurality of modules are connected to one another to form a single, combined transparent body.

* * * * *